United States Patent [19]

Manabe et al.

[11] 4,369,225

[45] Jan. 18, 1983

[54] FLEXIBLE LUSTROUSLY METALLIZED RESINOUS ARTICLES AND A PROCESS FOR MANUFACTURING SAME

[75] Inventors: Katsuhide Manabe, Ichinomiya; Toshiyasu Ito, Kasugai; Masatoshi Tsutsui, Inazawa, all of Japan

[73] Assignee: Toyoda Gosei Kabushiki Kaisha, Aichi, Japan

[21] Appl. No.: 219,367

[22] Filed: Dec. 22, 1980

[30] Foreign Application Priority Data

Dec. 27, 1979 [JP] Japan ................................ 54-169206

[51] Int. Cl.$^3$ ........................ B32B 15/08; B32B 27/40
[52] U.S. Cl. .................................... 428/334; 293/120; 204/192 C; 427/404; 427/407.1; 427/409; 427/412.1; 428/31; 428/423.3; 428/424.7; 428/424.8; 428/425.8; 525/130
[58] Field of Search ............... 428/425.8, 424.7, 423.3, 428/31, 424.8, 424.2, 334; 525/130; 293/120; 204/192 C; 427/421, 404, 409, 407.1, 412.1

[56] References Cited

U.S. PATENT DOCUMENTS

| | | | |
|---|---|---|---|
| 3,653,950 | 4/1972 | Bonsignore | 428/424.2 |
| 4,005,238 | 1/1977 | Gaehde | 428/425.8 |
| 4,016,305 | 4/1977 | Wakabayashi | 204/192 C |
| 4,104,432 | 8/1978 | Manabe | 428/423.3 |
| 4,180,448 | 12/1979 | Soshiki | 204/192 C |
| 4,305,981 | 12/1981 | Muroi | 428/31 |

FOREIGN PATENT DOCUMENTS 36-19492 10/1961 Japan .

*Primary Examiner*—Ellis P. Robinson
*Attorney, Agent, or Firm*—Birch, Stewart, Kolasch & Birch

[57] ABSTRACT

A flexible lustrously metallized resinous article which comprises a molded article made of a thermoplastic polyurethane or a polyblend of a thermoplastic polyurethane and a thermoplastic synthetic resin, the molded article having been coated on the surface thereof with a flexible polyurethane paint as a base coat, a metal film applied by means of sputtering and a flexible polyurethane paint as top coat. The flexible lustrously metallized resinous article is manufactured by applying a flexible polyurethane paint as a base coat onto a molded article made of a thermoplastic polyurethane or a polyblend of a thermoplastic polyurethane and a thermoplastic synthetic resin, applying a metal film by means of sputtering onto the base coat after its curing, and thereafter applying a flexible polyurethane paint as a top coat onto the metal film. The resulting flexible lustrously metallized resinous article has a brilliant metallic luster and strong resistance to weathering action, abrasion, heat and warm water and when subjected to deformation the metallic film thereon will not crack. Thus, this article is useful as a protuberant ornaments, especially as protuberant parts of motor vehicles.

14 Claims, No Drawings

FLEXIBLE LUSTROUSLY METALLIZED RESINOUS ARTICLES AND A PROCESS FOR MANUFACTURING SAME

BACKGROUND OF THE INVENTION

1. Field of the Invention

The present invention relates to flexible lustrously metallized resinous articles and a process for manufacturing same. More particularly, the present invention relates to flexible lustrously metallized resinous molded articles comprised of thermoplastic resinous moldings as a substrate overlaid with a base coat, a metal film and a protective top coat in that order as well as a process for the manufacture of such flexible lustrously metallized resinous molded articles wherein a flexible resinous molded article is overlaid successively with a base coat, a metal film and a protective top coat by methods known per se.

2. Description of the Prior Art

The most generic method for furnishing resinous articles with metallic feeling and appearance is to form a metal film on the surface of the resinous articles. Heretofore, various methods have been proposed for the formation of a metal film on plastic products. Among these methods, a metal-painting method, a wet plating method, a hot-stamping method, a vacuum metallizing (metal vapor deposition) method, a sputtering method and the like ion-plating method have been used.

In recent years, flexible resinous products tend to be used in place of metallic products for bumper, front grill, head lamp housing and the like structures of motor vehicles according to the enforcement of the safety regulation for protuberant structures and for the purpose of weight-saving. In addition, a great demand exists in metallizing these flexible resinous products for improving their ornamental or aesthetic value in appearance.

On the other hand, however, resinous products metallized according to known conventional methods are limited only to those made of rigid resins such as ABS resin. No successful example has been reported hitherto on the satisfactory metallizing treatment for flexible resinous products.

A wet plating method which is one of the most popular methods for metallizing resinous products comprises applying a chemical metal-plating treatment onto the surface of the resinous products and then applying an electroplating treatment of a desired metal such as copper, nickel and chromium onto the chemically plated metal surface. The metal film formed on the surface of resinous products by such plating treatments has a thickness from several microns to several ten microns and spoils the soft flexible feeling of the resinous products because of poor malleability and ductility of such a relatively thick metal film. In a method for applying a metal-containing paint, the formed coating film exhibits good adhesion to the resinous products as substrate but the metal normally used in finely divided form in the paint fails to furnish the resinous products with a true metallic feeling. In case of a hot-stamping method wherein a metal foil used is satisfactorily thin, the soft flexible feeling of the products is not spoiled. However, this method has such a shortcoming that elongation of the metal foil is so small such that cracks are formed in the metal foil by deformation of the flexible resin.

A vacuum metallizing method or a sputtering method which has been increasingly popularized in recent years for furnishing resinous products with a metallic luster usually comprises applying a base coat onto the surface of a molded resinous article, forming a thin metal film by vapor deposition or sputtering on the surface of the base coat after its curing, and then applying a top coat serving as a protective layer onto the metal film. However, metallization of flexible resinous molded articles according to such a method for furnishing them with good metallic luster still has the disadvantage that the base coat used in such a method which must exhibit good adhesion to both of the flexible resin substrate and the metal film is poor in elongation (only 20–30%) one of the important characteristics required for the base coat, so that the base coat carrying the metal film tends to form cracks and is delaminated in the extreme case when the flexible resin substrate is subjected to deformation.

Accordingly, there is a great demand for developing an improved method for furnishing flexible resinous molded articles with a metallic luster, especially according to the vacuum deposition or sputtering method, without any problem developing of cracks or delamination in the metal film-carrying coat.

BRIEF SUMMARY OF THE INVENTION

Accordingly, it is an object of the present invention to provide flexible lustrously metallized resinous articles which overcome the drawbacks in the known arts.

It is another object of the present invention to provide flexible lustrously metallized molded resinous articles useful as parts for motor vehicles.

It is still another object of the present invention to provide the use of a polyurethane paint and a polyblend of a thermoplastic polyurethane and a thermoplastic synthetic resin as a base coat and a substrate, respectively, for flexible lustrously metallized resinous articles.

It is a further object of the present invention to provide a process for the manufacture of the flexible lustrously metallized resinous articles wherein a metal film is applied by means of sputtering onto the surface of the base coat.

Other and further objects, features and advantages of the present invention will become apparent more fully from the following description.

DETAILED DESCRIPTION OF THE INVENTION

The present inventors have done extensive research on the sorts of flexible resin substrates, paints and metals, the thickness of a metal film, the method for applying the metal film and drying conditions for the paints to find (a) an improved flexible resin substrate material, (b) a paint utilizable as the base coat which is excellent in adhesion to both of the flexible resin substrate and a metal film and in elongation as one of the important paint characteristics, (c) a metal excellent in malleability and ductility and in resistance to weathering action and (d) a paint utilizable as top coat which is excellent in adhesion to the metal and in resistance to both abrasion and weathering action. As a result of the extensive research, it has now been found that flexible lustrously metallized resinous articles which maintain a flexible feeling and permit neither formation of cracks on the lustrous surface nor delamination when the resinous articles are deformed can be obtained by using a specifically selected combination of a flexible resin substrate and flexible paints and applying a metal film by means of sputtering. The present invention has been accomplished on the basis of the above finding.

In accordance with one embodiment of the present invention, there is provided a flexible lustrously metallized resinous article which comprises a molded article made of a thermoplastic polyurethane or a polyblend of a thermoplastic polyurethane and a thermoplastic synthetic resin, the molded article having been overlaid or coated on the surface thereof with a flexible polyurethane paint as a base coat, a metal film applied by means of sputtering and a flexible polyurethane paint as a top coat in that order.

In accordance with another embodiment of the present invention, there is provided a process for the manufacture of a flexible lustrously metallized resinous article, which comprises applying a flexible polyurethane paint as a base coat onto a molded article made of a thermoplastic polyurethane or a polyblend of a thermoplastic polyurethane and a thermoplastic synthetic resin, applying a metal film by means of sputtering onto the base coat after its curing, and thereafter applying a flexible polyurethane paint as a top coat onto the metal film.

The flexible lustrously metallized resinous articles of this invention can be manufactured by the three successive treatments of a molded article of a thermoplastic polyurethane or a polyblend of a thermoplastic polyurethane and a thermoplastic synthetic resin as the substrate. In the first treatment, a flexible polyurethane paint as the base coat which has excellent adhesion to both of the substrate and a metal film formed by sputtering and in elongation is applied onto the surface of the molded article as a substrate. After curing of the base coat, a thin film of a metal having good malleability and ductility is then applied in the second treatment by sputtering of the metal onto the base coat whereby the molded article is furnished with a metallic luster. In the third or final treatment, a flexible polyurethane paint as a top coat which exhibits good adhesion to the metal film and which is excellent in weather-resistance and abrasion resistance is applied onto the metal film and cured.

Thermoplastic resin materials used for making molded articles include polyvinyl chloride, Surlyn (DuPont), polyester and polyurethane among which polyvinyl chloride and Surlyn are not suited for use in the present invention since polyvinyl chloride is usually incorporated on molding with a large amount of a plasticizer which will possibly attack a metal film formed on the surface of the resin to cause clouding or discoloration and Surlyn, which is a resin manufactured by combining a polyester resin with a metal, exhibits poor adhesion to the paint applied as the base coat. The use of a polyester is also not desirable since it exhibits poor adhesion to the paint applied as the base coat. For the above mentioned reasons, thermoplastic resin materials which, after molded into a desired shape, will become a substrate of the product of this invention are limited to those of the polyurethane series. Thermoplastic polyurethane elastomers of polyester or polyether series which are excellent in elasticity and cold-resistance and a polyblend of a thermoplastic polyurethane elastomer of polyester series and ABS resin are thus employed as a raw material for making molded articles.

The flexible polyurethane paint utilizable in the present invention as the base coat should be excellent in elongation and exhibit good adhesion to both of the metal film and the thermoplastic polyurethane or polyblend of the thermoplastic polyurethane and ABS resin as the substrate. In addition, the flexible polyurethane paint should preferably have high resistance against heat, weathering action and warm water. Especially preferred as the base coat is such a flexible polyurethane paint which is faster in curing velocity and has excellent heat resistance and elongation properties. Illustrative of the flexible polyurethane paint which satisfies the above requirements is a paint comprised predominantly of (a) a polyol of the polyester series having a hydroxyl number of 100–250 and a number average molecular weight of about 1000–4000 which has been prepared by copolymerizing a hydroxyalkyl methacrylate with a polycondensate of an aliphatic glycol and an aliphatic dicarboxylic acid mixed in an equivalent value with (b) a polyisocyanate containing 5–20% by weight of NCO groups.

Examples of the aliphatic glycol include straight chain glycols such as ethylene glycol, 1,2-propylene glycol, 1,3-butylene glycol and 1,6-hexanediol. On the other hand, examples of the aliphatic dicarboxylic acid include adipic acid, azelaic acid, sebacic acid and pimelic acid. These glycols and dicarboxylic acids are reacted together in a conventional manner to form the corresponding polycondensate, i.e. polyester. Illustrative of the hydroxyalkyl methacrylate compolymerizable with the polycondensate are, for example, 2-hydroxyethyl methacrylate, 2-hydroxypropyl methacrylate, 2-hydroxybutyl methacrylate, etc. These hydroxyalkyl methacrylates may be used as a mixture with alkyl methacrylates such as ethyl methacrylate, propyl methacrylate and butyl methacrylate. The copolymerization of the hydroxyalkyl methacrylate with the polyester (polycondensate) is carried out according to the method known per se. Usually, two or more of the polyols of polyester series thus obtained are mixed to adjust their hydroxyl numbers and their number average molecular weights to the ranges of 100–250 and 1000–4000, respectively.

Illustrative of the polyisocyanate are prepolymers of hexamethylene diisocyanate series, xylylene diisocyanate series and isophorone series having 5–20% by weight of NCO groups and a number average molecular weight of 100–2000.

These polyols and polyisocyanates in the form of prepolymers are mixed in an equimolar ratio and diluted with a thinner so that the resultant paint may have a viscosity suitable for application. Ordinary constituents of commercially available thinners, for example, aromatic hydrocarbons such as toluene, esters such as ethyl acetate and butyl acetate, ketones such as acetone, methyl ethyl ketone and methyl isobutyl ketone, ethers such as tetrahydrofuran, can also be used for the thinner of the present invention.

At the time of applying the flexible polyurethane paint as the base coat onto the substrate, all of the polyol component and the polyisocyanate component are not as yet reacted completely with each other and exist as such. When the molded article coated with the flexible polyurethane paint as base coat is heated in a drying chamber, all of the reactants are reacted to form the flexible polyurethane base coat. For convenience' sake, however, the paint, before curing, is called herein the polyurethane paint.

The metal utilizable for the metallization of the molded articles in the sputtering treatment should preferably have good malleability and ductility. In addition, the metal should be excellent in weather-resistance and corrosion-resistance. Examples of such metal include pure metals such as copper, silver, nickel and chromium, and alloys such as stainless steel and nickel-chromium. Tin, aluminum and the like metals are excellent in malleability and ductility but they are not preferable for outdoor use because of their very poor resistance to weathering action and corrosion by attack of chemicals.

The flexible polyurethane paint utilizable as top coat for protecting the metal film should be transparent and excellent in elongation and adhesion to the metal film. In addition, the paint should exhibit high resistance to weathering action, abrasion, heat and warm water. Illustrative of the flexible polyurethane paint which satisfies the above requirements is a paint comprised predominantly of an acrylic polyol having a hydroxyl number of 20–200 and a number average molecular weight of about 1000–4000 mixed in an equivalent value with a non-yellowing polyisocyanate having 5–20% by weight of NCO groups.

The acrylic polyol is derived from hydroxyalkyl methacrylates alone or as a mixture with alkyl methacrylates. Preferred examples of these methacrylates include methyl methacrylate, ethyl methacrylate, propyl methacrylate, butyl methacrylate, 2-hydroxyethyl methacrylate, 2-hydroxypropyl methacrylate, 2-hydroxybutyl methacrylate, etc. These methacrylates are partially polymerized or copolymerized to have the above defined hydroxyl number and number average molecular weight as well as an elongation (as top coat film) of 20–150%.

Illustrative of the non-yellowing polyisocyanate are prepolymers of hexamethylene diisocyanate series, tetramethylene diisocyanate series, phenylene diisocyanate series and tolylene diisocyanate series having 5–20% by weight of NCO groups and a number average molecular weight of about 100–2000.

These acrylic polyols and polyisocyanates are mixed in an equimolar ratio and diluted with a thinner so that the resultant paint may have a viscosity suitable for application. Various organic solvents used as thinner for the preparation of the paint as base coat can also be used for the paint as top coat.

If necessary, stabilizers, coloring agents, curing-accelerators and the like additives may be incorporated into the flexible polyurethane paints for the formation of base coat and/or top coat, unless the use of such additives oversteps the object of the present invention.

According to the process of the present invention, the flexible polyurethane paint as base coat is applied in the first treatment onto the surface of the molded articles of the thermoplastic polyurethane or a polyblend of the thermoplastic polyurethane and ABS resin. The application of the flexible polyurethane paint onto the substrate is carried out according to the method known per se, for example, by the aid of a spray gun or by dipping the molded articles into the paint. The base coat applied onto the surface of the substrate is dried by hot blast or by placing the coated article in a drying chamber at an elevated temperature whereby the solvents in the paint are allowed to evaporate and the paint is cured to form a base coat film integrally bound to the substrate. The thickness of the base coat is adjusted to about 5–30μ to ensure sufficient adhesion to both of the substrate and the metal film.

In the second or metallizing treatment, the metal or alloy is applied onto the base coat by sputtering. According to the sputtering treatment, the metal or alloy in the form of ionized particles is deposited on the base coat of the molded article under reduced pressure or vacuum. In view of the similarity of mechanism, "ion plating" and "metal vapor deposition" are often involved in the term "sputtering" in a broader sense of the meaning. Thus, the term "sputtering" is used herein to generally mean the so-called "dry plating" by "vacuum deposition" and "ion-plating" in addition to the inherent meaning of "sputtering". The thickness of the metal film is generally limited within the range of 150–500 Å. If the thickness of the metal film is less than 150 Å, the coverage of the metal film is insufficient so that the substrate can be seen through the metal film. On the other hand, if the thickness exceeds 500 Å, cracks will probably be formed in the metal film when the molded article is subjected to deformation.

In the third or protecting treatment of the metal film, the flexible polyurethane paint as top coat is applied onto the metal film in the same manner as described in the case of the base coat, for example, by spray-coating or dipping. The top coat is then subjected to a drying treatment conducted similarly as in the case of the base coat, for example, by sending hot blast, whereby the solvents in the paint are evaporated and the acrylic polyol and the polyisocyanate contained therein are reacted with each other to form a polyurethane protective top coat. The amount of the paint applied is properly adjusted so that the thickness of the dried paint may be within the range of 5–30μ, preferably 10–20μ.

The flexible lustrously metallized resinous molded articles of the present invention have durable brilliant metallic luster and strong resistance against weathering action, abrasion, heat and warm water. Accordingly, the molded products of the present invention are distinguished by their flexibility, high resistance to external influence and decorative effects represented by metallic luster. Thus, the products of the present invention are especially useful as parts of motor vehicles exposed under severe conditions. Because of flexibility and soft feeling, the products are particularly useful as protuberant parts of motor vehicles under the enforcement of the present safety regulations. Besides these applications, the products are also useful as indoor and outdoor ornaments and buffer materials.

The lustrous metal surface of the molded articles of the present invention forms no cracks nor streaks even if the molded articles are subjected to deformation, and is hardly susceptible to "clouding" or "whitening" resulting chiefly from degradation of the protective top layer by ambient harmful actions, such as heat, moisture and chemicals.

The present invention will now be illustrated in more detail by way of examples and comparative examples.

EXAMPLE 1

A louver (60 mm in width and 300 mm in length) as an auto-part was molded, using a flexible resin (Pandex PC-740, Dainihon Ink Chem. Co., Ltd., Japan) which is a polyblend of a thermoplastic polyurethane and ABS resin. The surface of the rectangular louver plate was wiped with gauge wetted with isopropyl alcohol and dried well at room temperature. A paint prepared by mixing (a) a polyesterpolyol prepolymer having a hydroxyl number of 200 obtained by copolymerizing 2-hydroxybutyl methacrylate with a polycondensate of ethylene glycol and adipic acid with (b) an isocyanate of hexamethylene diisocyanate series having 12% by weight of NCO groups in a mixing ratio of 4:5, adding to the mixture a thinner which was an equiweight mixture of toluene, xylene, ethyl acetate, methyl ethyl ketone, methyl isobutyl ketone and cellosolve acetate and adjusting the viscosity of the resultant paint to about 18 seconds in terms of Ford cup #4 value was applied as a base coat onto the surface of the rectangular louver plate by the aid of a spray gun until the thickness of the coat film became about 15μ, and then dried and cured for 120 minutes in a hot air drying chamber kept at 80° C.

A metal film having a thickness of 200 Å of a nickel-chromium alloy (containing 49% Ni and 22% Cr) was then formed on the surface of the rectangular plate by the aid of a direct current dipolar magnetron sputtering device under the following sputtering condition:

| [Sputtering condition] | |
|---|---|
| Degree of vacuum: | $5 \times 10^{-5}$ Torr. |
| Argon pressure: | $4 \times 10^{-4}$ Torr. |
| Discharge power: | 50 KW |
| Discharge time: | 40 seconds |

A paint prepared by mixing a polyol having a hydroxyl number of 50 and composed predominantly of butyl methacrylate and 2-hydroxybutyl methacrylate with hexamethylene diisocyanate containing 13% by weight of NCO groups (Sumidur, Sumitomo-Bayer Urethane Ind., Co., Ltd., Japan) in a mixing ratio of 5:3 and adding to the mixture a thinner which was an equiweight mixture of methyl ethyl ketone, ethyl acetate, toluene and cellosolve acetate, and adjusting the viscosity of the resultant paint to 18 seconds in terms of Ford cup #4 value was applied as top coat onto the metal film by the aid of a spray gun until the thickness of the top coat became about 10μ, and then dried and cured for 60 minutes in a hot air drying chamber maintained at 70° C.

A variety of performance tests were made on the resultant flexible lustrously metallized product, a result of which was as shown in Table 1.

EXAMPLE 2

A molded article of a flexible resin was overlaid on the surface thereof with a base coat in the same manner as described in Example 1, then with a metal film having a thickness of 200 Å by sputtering of stainless steel (SUS 310S) under the same sputtering condition as described in Example 1 and finally with the same top coat as described in Example 1.

A variety of performance tests were made on the resultant flexible lustrously metallized product, a result of which was as shown in Table 1.

COMPARATIVE EXAMPLE 1

Similarly to Example 1, a louver as one of the auto-parts was molded, using ABS resin. The surface of the rectangular louver plate was wiped with gauge wetted with isopropyl alcohol and dried well at room temperature. The louver was then overlaid on the surface thereof with a polyurethane paint as a base coat and dried to cure the paint.

A metal film having a thickness of 500 Å of a nickel-chromium alloy (containing 49% Ni and 22% Cr) was then formed on the surface of the rectangular plate by the aid of a direct current dipolar magnetron sputtering device under the following sputtering condition:

| [Sputtering condition] | |
|---|---|
| Degree of vacuum: | $5 \times 10^{-5}$ Torr. |
| Argon pressure: | $4 \times 10^{-4}$ Torr. |
| Discharge power: | 50 KW |
| Discharge time: | 100 seconds |

A polyurethane paint as then applied as a top coat onto the metal film and dried to cure the paint.

A variety of performance tests were made on the resultant flexible lustrous metallized product, a result of which was as shown in Table 1.

TABLE 1

| Test item | Test condition | Example 1 | Example 2 | Comparative Example |
|---|---|---|---|---|
| Hardness of product | Hardness tester (JIS A) | 95 | 95 | — |
| Heat-resistance | 450 hours in a constant temperature box kept at 80° C. | No change | No change | No change |
| Moisture-resistance | 450 hours in a constant temperature box kept at 50° C. and 100% humidity | No change | No change | No change |
| Warm water resistance | 450 hours in a deionized water kept at 40° C. | No change | No change | No change |
| Thermal chock resistance | A cycle of 80° C., −40° C. and 50° C. at 100% humidity repeated 5 times | No change | No change | No change |
| Weather resistance | 1000 hours in a sunshine weather-o-meter | No change | No change | No change |
| Abrasion resistance | Ford abrasion test (load: 700g) 150000 cycles | No change | No change | No change |
| Bending resistance | Bending test 40φ, 180° | No | No | — |

As is evident from the results shown in Table 1, the flexible lustrously metallized resinous articles of the present invention exhibit excellent performance at least equivalent to lustrously metallized resinous articles made of rigid resin, such as ABS resin. In addition, the products of the present invention are so flexible that they can easily be deformed by manual force whereby no cracks is are formed on the lustrous metal film. Thus, the product of the present invention is superior to rigid lustrously metallized resinous articles of the known arts which easily forms cracks on the lustrous surface on deformation.

It is understood that the preceding representative examples may be varied within the scope of the present invention, both as to the components and conditions, by one skilled in the art to achieve essentially the same results.

As many apparently widely different embodiments of the present invention may be made without departing from the spirit and scope thereof, it is to be construed that the present invention is not limited to the specific embodiments thereof except as defined in the appended claims.

What is claimed is:

1. A flexible lustrously metallized resinous article which comprises a molded article made of a thermoplastic resin selected from at least one member of the group consisting of a thermoplastic polyurethane and a polyblend of a thermoplastic polyurethane and a ABS resin, said molded article having a coating on the surface thereof comprising a flexible polyurethane paint as a base coat, a metal film having a thickness within the range from 150-500°A, which has been applied by means of sputtering, and a flexible polyurethane paint as a top coat, said flexible polyurethane paint base coat comprising a polyol of the polyester series having a hydroxyl number of 100-250 and a number average molecular weight of about 1000-4000 which has been prepared by copolymerizing a hydroxyalkyl methacrylate with a polycondensate of an aliphatic glycol and an aliphatic dicarboxylic acid selected from at least one member of the group consisting of adipic acid, azelaic acid, sebacic acid and pimelic acid mixed in an equivalent value with a polyisocyanate containing 5-20% by weight of NCO groups, and said flexible polyurethane paint top coat comprising an acrylic polyol having a hydroxyl number of 20-200 and a number average molecular weight of about 1000-4000 mixed in an equivalent value with a non-yellowing polyisocyanate comprising a prepolymer selected from at least one member of the group consisting of the hexamethylene diisocyanate series, tetramethylene diisocyanate series, phenylene diisocyanate series and tolylene diisocyanate series having 5-20% by weight of NCO groups and a number average molecular weight of about 100-2000.

2. A flexible lustrously metallized resinous article according to claim 1, wherein the aliphatic glycol is a straight chain glycol.

3. A flexible lustrously metallized resinous article according to claim 1, wherein the polyisocyanate is a prepolymer of hexamethylene diisocyanate series, xylylene diisocyanate series and isophorone diisocyanate series having 5-20% by weight of NCO groups and a number average molecular weight of 100-2000.

4. A flexible lustrously metallized resinous article according to claim 1, wherein the metal film applied by sputtering is selected from a film of stainless steel and a film of nickel-chromium.

5. A flexible lustrously metallized resinous article according to claim 1, wherein the acrylic polyol is derived from hydroxyalkyl methacrylates alone or as a mixture with alkyl methacrylates.

6. A process for the manufacture of a flexible lustrously metallized resinous article which comprises applying a flexible polyurethane paint as a base coat onto the surface of a molded article made of a thermoplastic resin selected from at least one member of the group consisting of a thermoplastic polyurethane and a polyblend of a thermoplastic polyurethane and a ABS resin, applying to said base coat a metal film having a thickness within the range of from 150-500°A by means of sputtering after curing said base coat and thereafter applying a flexible polyurethane paint as a top coat onto said metal film, said flexible polyurethane paint base coat comprising a polyol of the polyester series having a hydroxyl number of 100-250 and a number average molecular weight of about 1000-4000 which has been prepared by copolymerizing a hydroxyalkyl methacrylate with a polycondensate of an aliphatic glycol and an aliphatic dicarboxylic acid selected from at least one member of the group consisting of adipic acid, azelaic acid, sebacic acid and pimelic acid, mixed in an equivalent value with a polyisocyanate containing 5-20% by weight of NCO groups, and said flexible polyurethane paint top coat comprising an acrylic polyol having a hydroxyl number of 20-200 and a number average molecular weight of about 1000-4000 mixed in an equivalent value with a non-yellowing polyisocyanate comprising a prepolymer selected from at least one member of the group consisting of the hexamethylene diisocyanate series, tetramethylene diisocyanate series, phenylene diisocyanate series and tolylene diisocyanate series having 5-20% by weight of NCO groups and a number average molecular weight of about 100-2000.

7. A process according to claim 6, wherein the aliphatic glycol is a straight chain glycol.

8. A process according to claim 6, wherein the aliphatic dicarboxylic acid is selected from adipic acid, azelaic acid, sebacic acid and pimelic acid.

9. A process according to claim 6, wherein the metal film applied by sputtering is selected from a film of strainless steel and a film of nickel-chromium.

10. A process according to claim 6, wherein the acrylic polyol is derived from hydroxyalkyl methacrylates alone or as a mixture with alkyl methacrylates.

11. A process according to claim 6, wherein the flexible polyurethane paints as base coat and top coat are applied by the aid of a spray gun.

12. A process according to claim 6, wherein the thickness of the base coat applied is adjusted to about 5-30μ.

13. A process according to claim 6, wherein the thickness of the top coat applied is adjusted within the range of 5-30μ.

14. A process according to claim 6, wherein drying and curing the flexible polyurethane paints as base coat and top coat are effected by exposing to air at an elevated temperature.

* * * * *